US006762629B2

(12) United States Patent
Tam et al.

(10) Patent No.: US 6,762,629 B2
(45) Date of Patent: Jul. 13, 2004

(54) VCC ADAPTIVE DYNAMICALLY VARIABLE FREQUENCY CLOCK SYSTEM FOR HIGH PERFORMANCE LOW POWER MICROPROCESSORS

(75) Inventors: Simon M. Tam, Redwood City, CA (US); Stefan Rusu, Sunnyvale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/206,610

(22) Filed: Jul. 26, 2002

(65) Prior Publication Data

US 2004/0017234 A1 Jan. 29, 2004

(51) Int. Cl.[7] ............................................. H03B 19/00
(52) U.S. Cl. ...................... 327/114; 327/101; 327/361; 713/300
(58) Field of Search ........................... 327/165, 101, 327/355, 361, 512, 513, 83, 538, 20, 114; 702/99, 104; 713/130, 321–324, 300

(56) References Cited

U.S. PATENT DOCUMENTS

| | | |
|---|---|---|
| 4,300,048 A | 11/1981 | Barbier et al. |
| 4,551,031 A | 11/1985 | Ishikawa et al. |
| 5,021,679 A | 6/1991 | Fairbanks et al. |
| 5,046,858 A | 9/1991 | Tucker |
| 5,153,535 A | 10/1992 | Fairbanks et al. |
| 5,287,292 A | 2/1994 | Kenny et al. |
| 5,307,003 A | 4/1994 | Fairbanks et al. |
| 5,373,254 A | 12/1994 | Nakauchi et al. |
| 5,392,437 A | 2/1995 | Matter et al. ................ 713/324 |
| 5,495,617 A | 2/1996 | Yamada ....................... 713/323 |
| 5,557,551 A | 9/1996 | Craft .......................... 702/130 |
| 5,627,412 A | 5/1997 | Beard |
| 5,719,800 A | 2/1998 | Mittal et al. ................ 713/321 |
| 5,752,011 A | 5/1998 | Thomas et al. |
| 5,766,228 A * | 6/1998 | Bonnet et al. ................ 607/16 |
| 5,781,783 A | 7/1998 | Gunther et al. |
| 5,815,724 A | 9/1998 | Mates ......................... 713/323 |
| 5,822,369 A * | 10/1998 | Araki .......................... 375/237 |
| 5,832,284 A | 11/1998 | Michail et al. |
| 5,835,885 A | 11/1998 | Lin |
| 5,838,578 A | 11/1998 | Pippin |
| 5,902,044 A | 5/1999 | Pricer et al. |
| 5,964,881 A | 10/1999 | Thor |
| 5,974,557 A | 10/1999 | Thomas et al. |
| 6,029,006 A | 2/2000 | Alexander et al. .......... 713/223 |
| 6,078,356 A * | 6/2000 | Jensen ......................... 348/164 |
| 6,091,255 A | 7/2000 | Godfrey |
| 6,172,611 B1 | 1/2001 | Hussain et al. |
| 6,192,479 B1 | 2/2001 | Ko .............................. 713/300 |

(List continued on next page.)

FOREIGN PATENT DOCUMENTS

| | | |
|---|---|---|
| EP | 0549165 A2 | 6/1993 |
| EP | 0592783 A2 | 4/1994 |
| WO | WO 9917186 A1 | 4/1999 |

OTHER PUBLICATIONS

U.S. patent application No. 10/044,865; filed Oct. 22, 2001, "An Adaptive Variable Frequency Clock System for High Performance Low Power Microprocessors," Atty. Dkt. No. 042390.P12016, 35 pages including Figures.

(List continued on next page.)

*Primary Examiner*—Minh Nguyen
(74) *Attorney, Agent, or Firm*—Ami Patel Shah

(57) ABSTRACT

A method and an apparatus for dynamically varying a clock frequency in a processor to adapt to VCC voltage changes. The method of one embodiment includes sampling a supply voltage at a plurality of locations. The values of said supply voltage are communicated to a clock generator. A clock frequency of a clock signal generated from the clock generator is adjusted in response to an evaluation of the sampled values of the supply voltage.

30 Claims, 9 Drawing Sheets

U.S. PATENT DOCUMENTS

| | | |
|---|---|---|
| 6,211,740 B1 | 4/2001 | Dai et al. .................... 331/2 |
| 6,216,235 B1 | 4/2001 | Thomas et al. |
| 6,219,796 B1 | 4/2001 | Bartley .................... 713/320 |
| 6,393,374 B1 | 5/2002 | Rankin et al. |
| 6,407,595 B1 * | 6/2002 | Huang et al. ............ 327/114 |
| 6,487,668 B2 | 11/2002 | Thomas et al. |
| 6,559,631 B1 * | 5/2003 | Balch et al. .............. 324/142 |
| 2001/0021217 A1 | 9/2001 | Gunther et al. |
| 2002/0143488 A1 | 10/2002 | Cooper et al. |

OTHER PUBLICATIONS

U.S. patent application No. 09/471,795; filed Dec. 23, 1999, "Microprocessor with Digital Power Throttle," Atty. Dkt. No. 042390.P7758, 31 pages including Figures.

U.S. patent application No. 10/041,092; filed Dec. 28, 2001, "Digital Throttle for Multiple Operating Points," Atty. Dkt. No. 042390.P12492, 30 pages including Figures.

U.S. patent application No. 10/227,125; filed Aug. 23, 2002,"An Apparatus for Thermal Management of Multiple Core Microprocessors," Atty Dkt. No. 042390.P14509, 21 pages including Figures.

U.S. patent application No. 10/041,013; filed Dec. 28, 2001, "Multiple Mode Power Throttle Mechanism," Atty. Dkt. No. 042390.P12491, 32 pages including Figures.

* cited by examiner

VCC ADAPTIVE DYNAMICALLY VARIABLE FREQUENCY CLOCK SYSTEM FOR HIGH PERFORMANCE LOW POWER MICROPROCESSORS

FIELD OF THE INVENTION

The present invention relates generally to the field of microprocessors and computer systems. More particularly, the present invention relates to a method and apparatus for a VCC adaptive dynamically variable frequency clock system for microprocessors.

BACKGROUND OF THE INVENTION

In recent years, the price of personal computers (PCs) have rapidly declined. As a result, more and more consumers have been able to take advantage of newer and faster machines. Computer systems have become increasingly pervasive in our society. But as the speed of the new processors increases, so does the power consumption. Furthermore, high power consumption can also lead to thermal issues as the heat has to be dissipated from the computer system. One popular way to reduce power is to lower the operating voltage of the devices. However, the circuitry becomes more susceptible to any voltage droops and other transients.

A high clock frequency is one of the principal performance drivers for a high performance microprocessor design. One common method for achieving higher performance is to increase the processor operating frequency. But as semiconductor process technology continues to scale and improve, the integrated circuit designs need to be optimized to track the device scaling trends and to meet new power reduction requirements. The device specifications detailing 5 volt VCC supply voltages from earlier times are making way for the more recent specifications outlining 1 volt and even sub 1 volt VCC ranges. While the aggressive scaling of operating voltages has worked towards achieving these criteria, supply voltage issues have arisen in their place.

Power is linearly proportional to the operating frequency (i.e. Power $\propto$ Frequency$\cdot$Voltage$^2$). Thus power dissipation can be lowered by decreasing the operating frequency at selected times. Similarly, the reduction of the VCC voltage leads to reduced power dissipation as power is directly proportional to the VCC level wherein power$\propto$VCC$^2$. Furthermore, these voltage reductions are often implemented in conjunction with aggressive frequency techniques in order to optimizing performance.

Frequency/voltage adjustment methods can be used to alter the circuit performance. However, modifications to a core clock signal during processor operation can cause errors to the system. Typically, existing frequency adjustment schemes need to stop or pause the processor core before adjusting the clock frequency or modifying the bus ratio. Frequencies are changed in a clocked device by placing the device in an idle state, changing the core clock frequency to the new frequency, and locking the PLL in phase with the new frequency. The length of the idle state required for the changing and locking to occur slows down the system. Such a pause can have a significant impact on the overall performance of a desktop or server.

BRIEF DESCRIPTION OF THE DRAWINGS

The present invention is illustrated by way of example and not limited in the figures of the accompanying drawings, in which like references indicate similar elements, and in which.

DETAILED DESCRIPTION

Figure 1:
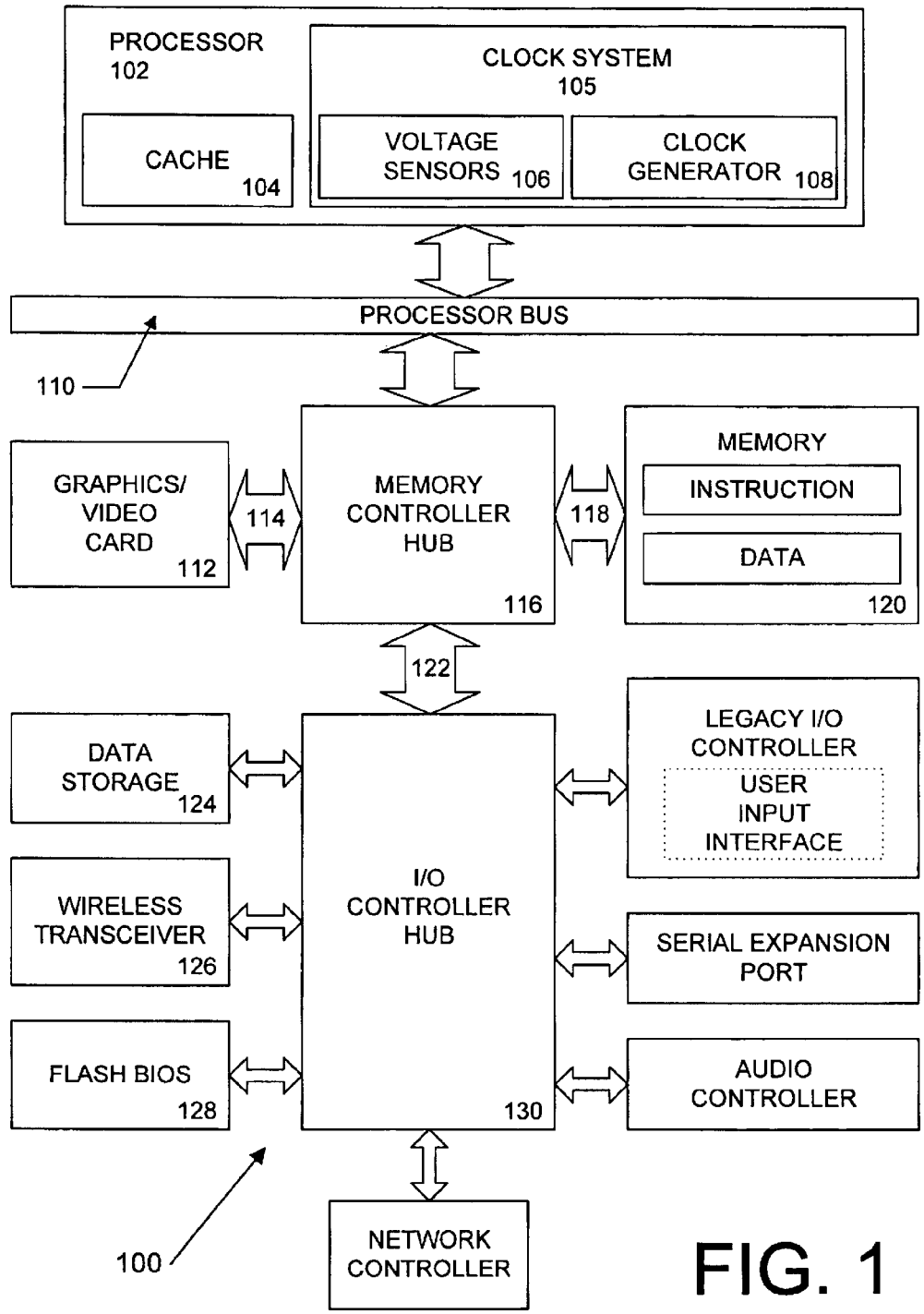
FIG. 1 is a block diagram of a computer system formed with a processor that includes a VCC adaptive dynamically variable frequency clock system in accordance with one embodiment of the present invention.

A method and apparatus for a VCC adaptive dynamically variable frequency clock system is disclosed. The embodiments described herein are described in the context of a microprocessor, but are not so limited. Although the following embodiments are described with reference to a processor, other embodiments are applicable to other integrated circuits or logic devices. The same techniques and teachings of the present invention can easily be applied to other types of circuits or semiconductor devices that can benefit from power savings and avoiding voltage droop transients.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

Many present day microprocessors consume significant amounts of power during normal operations. This power consumption has also led to issues in power dissipation. Processors and systems are generally designed to operate within set thermal envelopes. As the performance and power requirements increase, this envelope can often be pushed to the limit or even exceeded. Power dissipation has been determined to be proportional to the product of the operating frequency and the power supply voltage squared. One disadvantage of existing clock architectures is that the core operating frequency is fixed. The core frequency of a typical processor is determined by the bus fraction ratio N.

A recent technique for lowering the power dissipation of a processor involves dynamically adjusting the core frequency and/or the power supply voltage. By dynamically adjusting the frequency and voltage, the operating point of the processor can be shifted from a high performance state to a lower performance state and vice versa, while the processor continues to operate normally. The clock frequency is adjusted at smaller increments and result in a transparent change relative to the processor core. Thus the operation of the processor can be managed such that the necessary performance level is achieved while keeping the processor within the allowable thermal and power specifications. Designers may find it highly desirable to have a clocking architecture that can support dynamically frequency and voltage transitions without a latency penalty or performance loss.

But a reduction in the power supply voltage can be constrained by issues such as inductive power supply current transients that can lead to significant on-die voltage droops or increased circuit delay sensitivities to the VCC supply voltage; A combination of these power supply constraints can cause a circuit design to become highly susceptible to voltage induced circuit timing failures and errors. Furthermore, similar timing failures can result from voltage droop transients triggered from frequency throttling techniques. Thus efficient techniques to combat voltage droop transients and supply fluctuations can be highly beneficial.

One typical methods involves the use of frequency guard bands to avoid the effects of voltage changes. With guard banding, a integrated circuit is tested and validated at a high operating frequency than stated in the specification in order to guarantee proper functionality at the lower frequency ranges. However, inaccuracies in the tester equipment can lead to undesirably increasing frequency guard bands and imposing a significant cost to the overall product design.

Another typical technique to reduce on-die voltage transients employs the use of conventional on-die and on-package decoupling capacitors. However, the on-die capacitors are often fabricated on CMOS processes that have leaky gate dielectrics. The use of such capacitors become significant design constraints as dielectric leakage increase, because the leakage degrades the power budget. Furthermore, a limited number of on-die capacitors can be accommodated due to the high cost of silicon real estate. Likewise, on-package decoupling capacitors are expensive discrete packages that need to be physically mounted and are ineffective in reducing on-die voltage droops due to the remote distance of the capacitors from the die.

Embodiments of the present invention adapt the clock signal to voltage droops and fluctuations by dynamically adjusting the clock frequency based on sensed on-die voltage changes. For instance, when a droop is detected, the clock is slowed down to accommodate the reduced voltage level. Similarly, when the voltage recovery is detected, the clock frequency can be increased to enhance performance. Thus a mechanism in accordance with the present invention provides an ability to tailor a clock frequency based on realistic supply voltage levels and to alter the overall performance intelligently. So when the on-die voltage droop is negligible, a higher operating frequency can still be employed while a lower frequency is implemented when a significant voltage droop is sensed. Furthermore, the intrinsic frequency guard band for the part can be reduced because the frequency adjustment mechanism actively tracks the voltage/frequency to ensure a proper match.

The present invention can provide a dynamically adaptive frequency adjustment technique that is optimal for low-cost and high volume servers. Embodiments of the present invention when implemented in conjunction with a matching voltage control mechanism can extend power management capabilities that are presently available to mobile systems to desktop and multiprocessor server systems. One embodiment of the clock control technique described below implements on-die voltage sensing and adjusts the clock frequency accordingly. These sensors can detect voltage fluctuations and reduce the operating frequency as needed to match the detected VCC voltage decrease.

Referring now to FIG. 1, an exemplary computer system 100 is shown. System 100 includes a component, such as a processor 102, to employ a VCC adaptive dynamically variable frequency clock system 105 in accordance with the present invention, such as in the embodiment described herein. System 100 is representative of processing systems based on the PENTIUM® III, PENTIUM® 4, Itanium™, and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, the present invention is not limited to any specific combination of hardware circuitry and software.

The present enhancement is not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which includes a mechanism for handling voltage droops transients for other embodiments.

FIG. 1 is a block diagram of a computer system 100 formed with a processor 102 that includes a VCC adaptive dynamically variable frequency clock system 105 in accordance with the present invention. The present embodiment is described in the context of a single processor desktop or server system, but alternative embodiments can included in a multiprocessor system. System 100 is an example of a hub architecture. The computer system 100 includes a processor 102 to process data signals. The processor 102 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 is coupled to a processor bus 110 that can transmit data signals between the processor 102 and other components in the system 100. The elements of system 100 perform their conventional functions well known in the art.

In one embodiment, the processor 102 includes an internal cache memory 104. Depending on the architecture, the processor 102 can have a single internal cache or multiple levels of internal caches or an external cache. A clock system 105 including voltage sensors 106 and a clock generator 108 also resides in the processor 102. Alternate embodiments of a VCC adaptive dynamically variable clock system 208 can also be used in microcontrollers, embedded processors, graphics devices, DSPs, and other types of logic circuits. System 100 includes a memory 120. Memory 120 can be a dynamic random access memory (DRAM) device, a static random access memory (SRAM) device, flash memory device, or other memory device. Memory 120 can store instructions and/or data represented by data signals that can be executed by the processor 102. For the embodiment of a processor system 100, the processor 102 has the capability to control its own voltage and frequency operating points through an on-chip controller.

A system logic chip 116 is coupled to the processor bus 110 and memory 120. The system logic chip 116 in the illustrated embodiment is a memory controller hub (MCH). The processor 102 can communicate to the MCH 116 via a processor bus 110. The MCH 116 provides a high bandwidth memory path 118 to memory 120 for instruction and data storage and for storage of graphics commands, data and textures. The MCH 116 is to direct data signals between the processor 102, memory 120, and other components in the system 100 and to bridge the data signals between processor bus 110, memory 120, and system I/O 122. In some embodiments, the system logic chip 116 can provide a graphics port for coupling to a graphics controller 112. The MCH 116 is coupled to memory 220 through a memory interface 218. The graphics card 212 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices via a local I/O bus. The local 110 bus is a high speed 110 bus for connecting peripherals to the memory 120, chipset, and processor 102. Some examples are the audio controller, firmware hub (flash BIOS) 128, data storage 124, legacy I/O controller containing user input and keyboard interfaces, a serial expansion port such as Universal Serial Bus (USB), wireless transceiver 126, and a network controller. The data storage device 124 can comprise a hard disk drive, a floppy disk drive, a CD-ROM device, a flash memory device, or other mass storage device.

For another embodiment of a computing system 100, a VCC adaptive dynamically variable clock mechanism 105 can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

Figure 2:
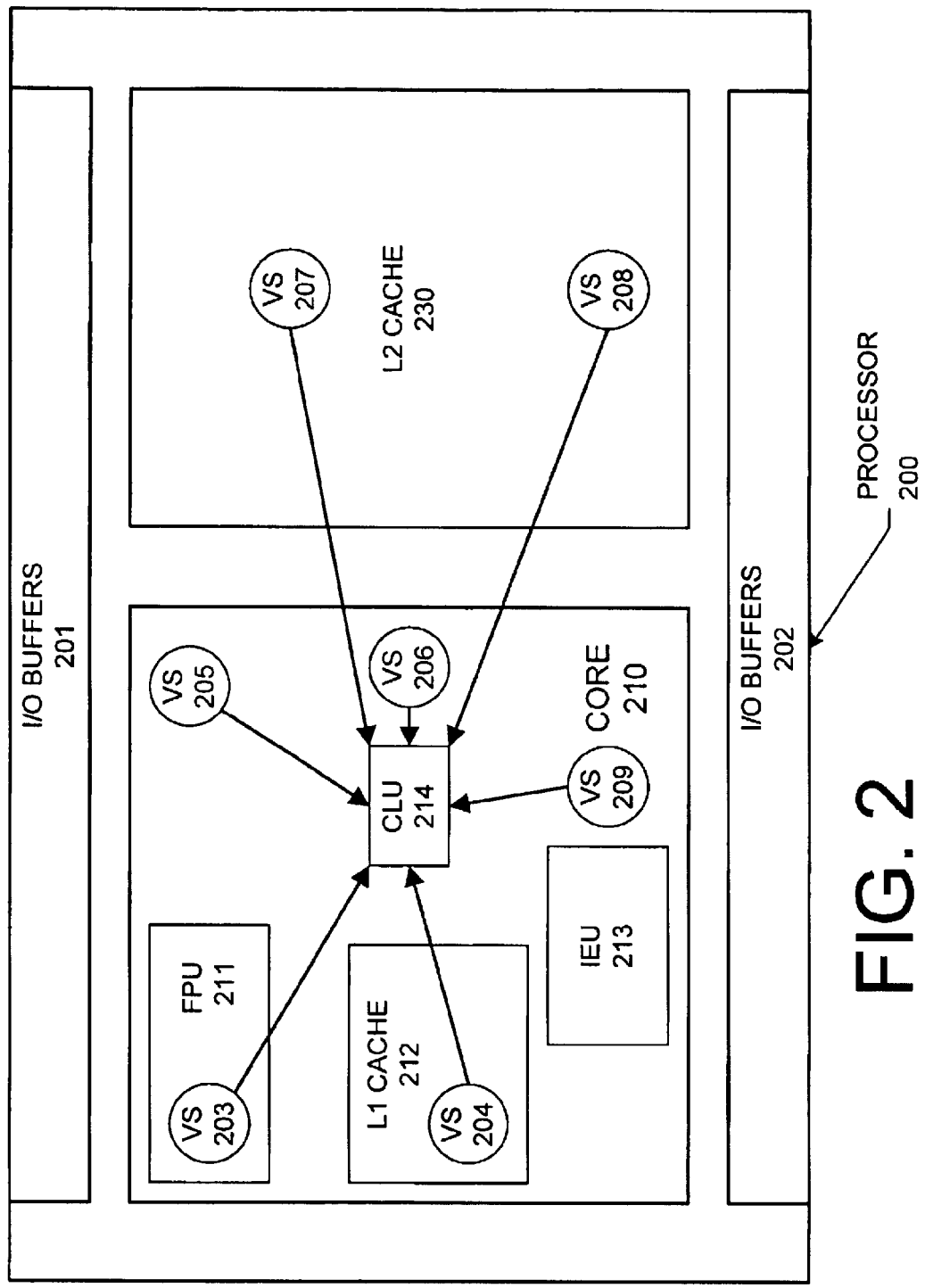
FIG. 2 is a block diagram of a processor that includes on-die voltage sensors and adaptively variable clock generator in accordance with the present invention.

FIG. 2 is a block diagram of a processor that includes on-die voltage sensors and adaptively variable clock generator in accordance with the present invention. Embodiments of the present invention incorporate one voltage sensors to monitor the on-die VCC supply voltages. These sensors can be strategically placed at various locations such as high voltage circuitry, critical circuits, power bussing, and high speed logic, for example. The processor floor plan of FIG. 2 shows some of the functional blocks of a single processor die. The top and bottom I/O buffers 201, 202, are to handle input and output communications between the processor die and the outside world. The core block 210 includes a floating point unit FPU 211, level 1 L1 cache memory 212, an integer execution unit IEU 213, and a clock generation unit CLU 214. A level 2 L2 cache 230 also resides on the die.

For this embodiment, a network of voltage sensors 202, 204, 205, 206, 207, 208, 209, are distributed in the core 210 and L2 cache 230 to get an accurate and useful view of the power environment. In other embodiments, the number of sensors can vary widely depending on the particular implementation. Similarly, the placement of these sensors are designer/application specific. In FIG. 2, the sensor 206 closest to the clock generator is a reference sensor to detect a baseline VCC voltage level. Two sensors 207, 208, are located in the L2 cache 230. Other sensors 203, 204, 209, are located with or around the FPU 211, L1 cache 212, and IEU 213, respectively, to sense the supply voltages in those regions. These sensors 203, 204, 205, 206, 207, 208, 209, are to detect the local VCC voltage levels and to communicate that information back to the clock generator 214. Logic in the clock generator 214 monitors the voltage statuses and can dynamically adapt and adjust the clock frequency based on the sensed information. For example, a local sensor in a high activity area such as the FPU can better indicate the existence of a critical low voltage condition in that circuitry and inform the clock generator of a need to lower the operating frequency. But when the FPU is inactive, another different sensor may read low and another circuit may be the controlling factor.

Thus if VCC droop transients arises, the clock generator can detect the voltage decrease based on data from the on-die voltage sensors and react by reducing the operating frequency in order to avoid any circuit timing failures or computation errors. Furthermore, less frequency guard band is needed as the frequency adjustment circuit can actively respond to voltage fluctuations instead of simply setting aside and wasting a large frequency band to avoid voltage transients. Embodiments of the present invention can also help to reduce or eliminate the need for on-die and/or on-package decoupling capacitors to suppress on-die voltage droops. Unlike on-die activity generators, embodiments of the present invention can avoid the unnecessary and wasteful dissipation of power and generation of heat.

Figure 3:
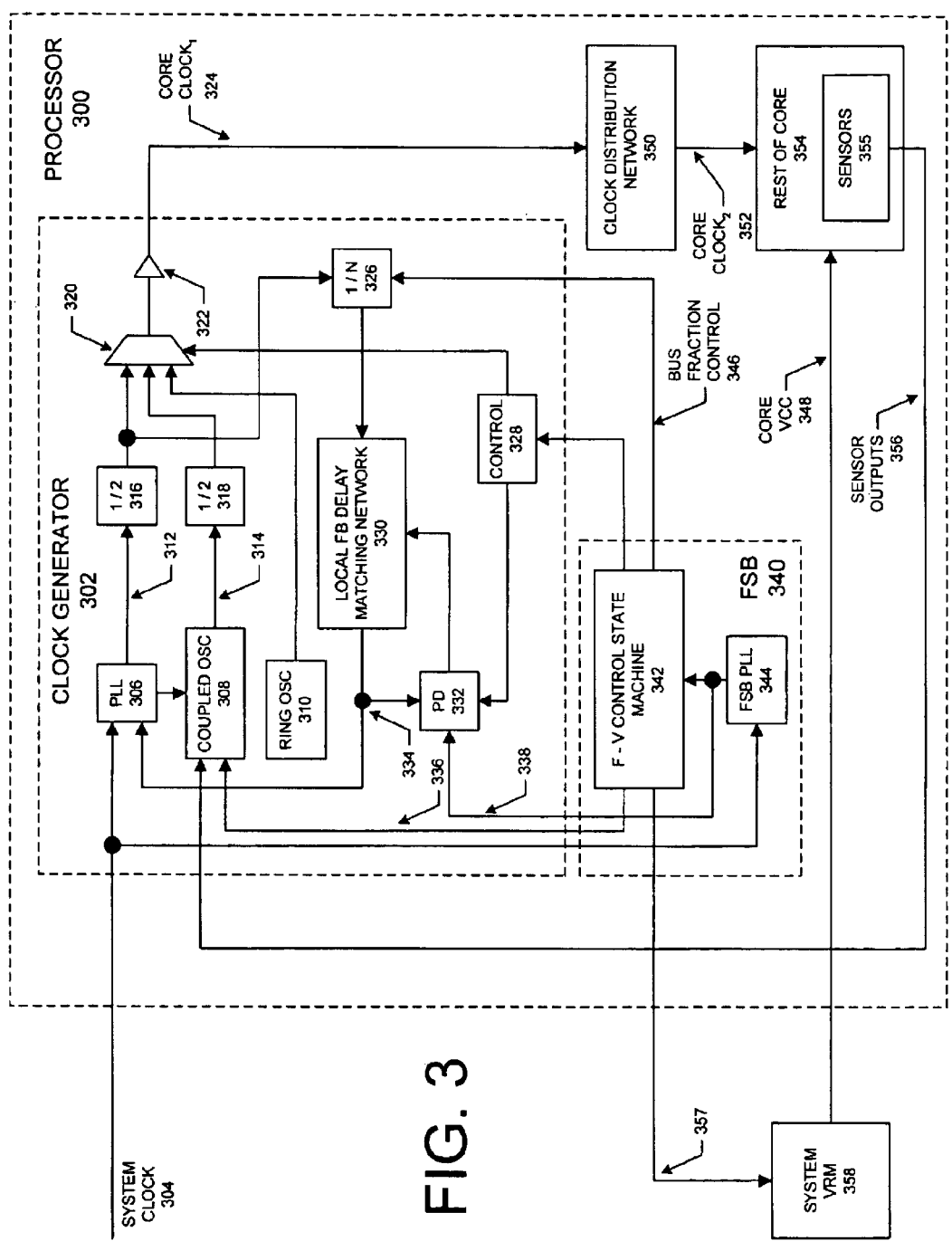
FIG. 3 is a block diagram of a processor architecture having an adaptive dynamically variable frequency clock system in accordance with the present invention.

FIG. 3 is a block diagram of a processor architecture having a mechanism for dynamically adjusting a clock frequency in order to adapt to varying supply voltages in accordance with the present invention. The processor 300 contains a clock generator 302 and a front side bus (FSB) unit 340. The clock generator 302 is a VCC adaptive dynamically variable frequency clock system capable of varying the frequency of its clock output in response to voltage sensors 355. Clock generator 302 is to provide an internal processor clock signal CORE CLOCK$_1$ 324 to the rest of the processor core 354 via a clock distribution network 350. The FSB unit 340 contains a FSB PLL 344 and can generate its own FSB clock signal 338.

The clock generator 302 comprises a phase locked loop (PLL) clock generator 306, coupled oscillator clock generator 308, a ring oscillator 310, and a local feedback delay matching network 330. The ring oscillator 310 is to provide the processor 300 with a clock signal, the frequency of which is not well controlled and may not be constant. The ring oscillator 310 is used to clear contention problems during the very early power up stage when the supply voltage is still ramping. The on-chip PLL 306 can multiply the frequency of the system clock 304 to generate the on-chip core clock (Core Clock$_1$) 324. The configuration of the PLL 306 in the clock generator 302 enables the microprocessor core frequency to be significantly higher, N times greater in this case, than the system frequency. The coupled oscillator circuit 308 is capable of providing a clock signal of varying frequencies. The outputs 312, 314 from the PLL 306 and coupled oscillator 308, respectively, pass through frequency dividers 316, 318 that multiply the frequency of the signal by "½" prior to the multiplexor 320 in order to attain a 50% duty cycle core clock. Other values may be used in place of "½". Although this frequency multiplication is customarily done in some implementations, it may be omitted in some alternative embodiments. The multiplexor 320 is to receive the output signals from the PLL 306, coupled oscillator 308, and the ring oscillator 310 and output one of the signals depending on the select from control circuit 328. The multiplexor output passes through a buffer 322 to the clock distribution network 350 before reaching the rest of the core 354.

For this embodiment, the PLL circuit 306 is to provide the initial clock signal for the processor core 354 during system startup. When the processor reaches a stable operating point, the clock output of the coupled oscillator 308 can be switched over as the output of the multiplexor 320 and becomes CORE $CLOCK_1$ 324 instead of the PLL clock signal 312. The clock signal from the PLL 306 is also coupled to a local feedback delay matching network 330 through a "1/N" frequency divider 326. The local feedback delay matching network imitates the delay of the clock distribution network. The output of the delay network 330 is coupled back to the PLL 306. Thus the PLL output 312 is fed back to the PLL circuit to ensure that the PLL clock signal is still in phase and in sync with the system clock 304.

The system voltage regulator module (VRM) 358 receives a control signal 356 from the F-V control state machine (CSM) 342 that controls the voltage output of the VRM 358. The VRM 358 is to supply a VCC supply voltage 348 to the processor core 354. The F-V CSM also provides control signals to the clock generator control 328 and the "1/N" frequency divider 326 to control the frequency of the clock generator output 324. The coupled oscillator 308 also receives control signals 336 from the F-V CSM 342 that indicate what frequency the coupled oscillator 308 is to output as the coupled oscillator is capable of operating at a variety of frequencies depending on the setting.

Embodiments of the present invention can allow for the dynamic adjustment of the core frequency in order to reduce the effects of voltage droop transients. Droops may occur during periods of high activity at specific areas of a die. Power supply variations can also arise from abnormal dI/dt spikes as well as resistive drops in routing. The clock generation system of the present embodiment uses voltage sensors 355 distributed around the processor die. The sensors communicate voltage information to the clock generator 302. Upon receipt of the voltage information, the clock circuitry 302 can evaluate the data and respond accordingly. If any of the sensors indicated that any voltage droops or transients exist, the clock signal can be adjusted to avoid performance errors and to maintain consistent power draw. Thus the processor core 354 can continue to operate despite non-optimal voltage conditions at certain locations on the die.

Figure 4:
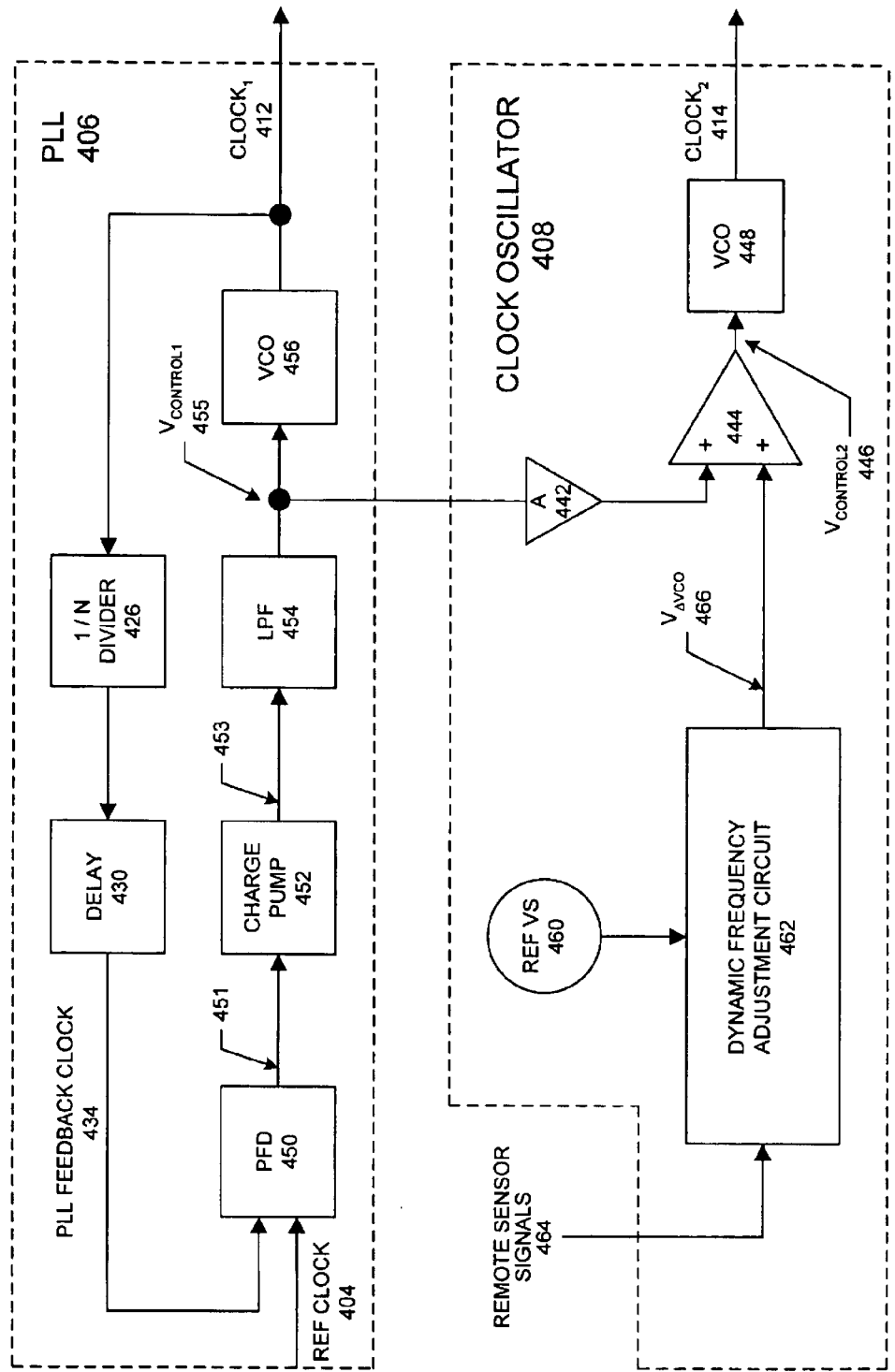
FIG. 4 is a block diagram of a clock generator structure incorporating a dynamic frequency adjustment feature of one embodiment.

FIG. 4 is a block diagram of a clock generator structure incorporating a dynamic frequency adjustment feature of one embodiment. FIG. 4 illustrates in more detail the PLL and the coupled clock generator architecture of FIG. 3. A PLL 406 is used to generate a reference clock frequency 412 and a coupled oscillator structure 408 is used to generate the actual core clock 414. The PLL 406 of this embodiment contains a phase frequency detector (PFD) 450, charge pump 452, low pass filter (LPF) 454, and voltage controlled oscillator (VCO) 456. A local feedback delay matching network 430 provides delay to the PLL feedback loop after a "1/N" frequency divider 426. PLL 406 receives a reference clock signal 404 from outside. In this example, the reference clock 404 is a system clock signal. PFD 450 is to compare the arrival times and phases of the reference clock signal 404 and the PLL feedback clock signal 434 to detect a difference between the two signals. PFD 450 is to output a control signal 451 to charge pump 452 based on this difference. Control signal 451 may instruct charge pump 452 to output more, less, or the same amount of voltage. Charge pump 452 can then output an appropriate amount of charge 453. LPF 454 is to filter the signal 453 and to output $V_{CONTROL1}$ 455. VCO 456 is to generate PLL clock signal $CLOCK_1$ 412 based on the value of $V_{CONTROL1}$ 455. An increase in the voltage of $V_{CONTROL1}$ 455 can cause VCO 456 to increase the frequency of $CLOCK_1$ 412, while a decrease in voltage can cause VCO 456 to decrease the frequency of $CLOCK_1$ 412. Frequency divider 426 is to multiply the frequency of $CLOCK_1$ 412 by "1/N" prior to delay 430. The delayed clock signal, PLL feedback clock 434, is connected to PFD 450 to complete the local clock generator feedback loop. The PLL 406 is locked in phase with the reference clock signal 404. In this embodiment, the core PLL 406 has its own feedback loop and is not disturbed. The PLL 406 can continue to operate in a locked fashion generating a stable $V_{CONTROL1}$ voltage 455 even though the frequency of the core clock signal is being adjusted.

The coupled clock generator (oscillator) 408 of this embodiment contains a VCO 448, a dynamic frequency adjustment circuit 462, and a current-to-voltage summing amplifier 444. Current-to-voltage summing amplifier 444 converts its current inputs into a voltage output. The frequency adjustment circuit 462 receives inputs from a local reference voltage sensor 460 and remote sensor signals 464. The local reference voltage sensor 460 is to sense supply voltages in the circuitry in and around the clock generator 408. Because the local voltage sensor 460 is proximate to the clock generator 408 in this embodiment, its output is used as the reference value of the VCC supply voltage. Similarly, a number of voltage sensors are distributed over the integrated circuit to provide supply voltage readings from other circuit locations. These sensors are to detect the voltage of the supply available to the surrounding circuitry and to communicate the voltage values to the clock generator 408. Upon receipt of the sensor data, the dynamic frequency adjustment circuit 462 can evaluate the supply voltage conditions and dynamically adapt the clock oscillator output 414 appropriately.

The dynamic frequency adjustment circuit outputs a $V_{\Delta VCO}$ 466 value to a summing amplifier 444. Based on the sensor readings, the adjustment circuit 462 can drive $V_{\Delta VCO}$ 466 to decrease the clock frequency if a voltage droop transient occurs or if the supply voltage is low somewhere on the die. Similarly, the adjustment circuit 462 can drive $V_{\Delta VCO}$ 466 to increase the clock frequency to enhance processor performance when optimal conditions exist. The coupled oscillator 408 is coupled to PLL 406 and receives $V_{CONTROL1}$ 455 through an amplifier 442. Summing amplifier 444 evaluates the input values and outputs a $V_{CONTROL2}$ 446 signal to VCO 448. Thus the control voltage $V_{CONTROL2}$ 446 to the VCO 448 of the coupled clock generator 408 is dependent on the control voltage $V_{CONTROL1}$ 455 of the core PLL 406. VCO 448 generates coupled oscillator clock signal $CLOCK_2$ 414 based on the value of $V_{CONROL2}$ 446.

The coupled clock generator 408 of this embodiment uses a VCO 448 that has its control voltage $V_{CONTROL2}$ 446 referenced to the core PLL VCO control voltage $V_{CONTROL1}$ 455. Control voltage $V_{CONTROL2}$ 446 is the sum of $V_{CONTROL1}$ 455 and a $V_{\Delta VCO}$ 466 that is derived from the voltage readings from the sensors. $V_{CONTROL2} = V_{CONTROL1} + V_{\Delta VCO}$, where $V_{\Delta VCO}$ is based on remote sensor signals 464 and a reference voltage signal via the dynamic frequency adjustment circuit 462.

At initial processor startup, the core PLL output $CLOCK_1$ 412 is selected. The clock system goes through a normal startup process wherein the core PLL 406 locks to the external system clock 404. The control voltage $V_{CONTROL1}$ 455 of core PLL VCO 456 will reach a stable value reflecting a stable operating frequency consistent with the system clock frequency and the bus fraction ratio. Because the VCO 448 of the coupled clock generator 408 is referenced to the control voltage 455 of core PLL VCO 456, the coupled clock generator VCO 448 will oscillate at the same frequency as the core PLI 406.

After the stabilization of the core PLL 406, the clock logic selects the coupled oscillator output CLOCK$_2$ 414 as the clock for the processor core. For this embodiment, the initial frequency offset of CLOCK$_2$ 414 from CLOCK$_1$ 412 is zero. Thus the core will continue to operate at the same initial frequency when the core clock is switched from CLOCK$_1$ 412 to CLOCK$_2$ 414. Subsequently, the clock control logic can adjust the processor clock frequency to shift the processor operating point to meet certain power conditions. The operating frequency can be adjusted when supply voltages vary across the die in order to achieve the desired power and performance trade off.

Figure 5A:
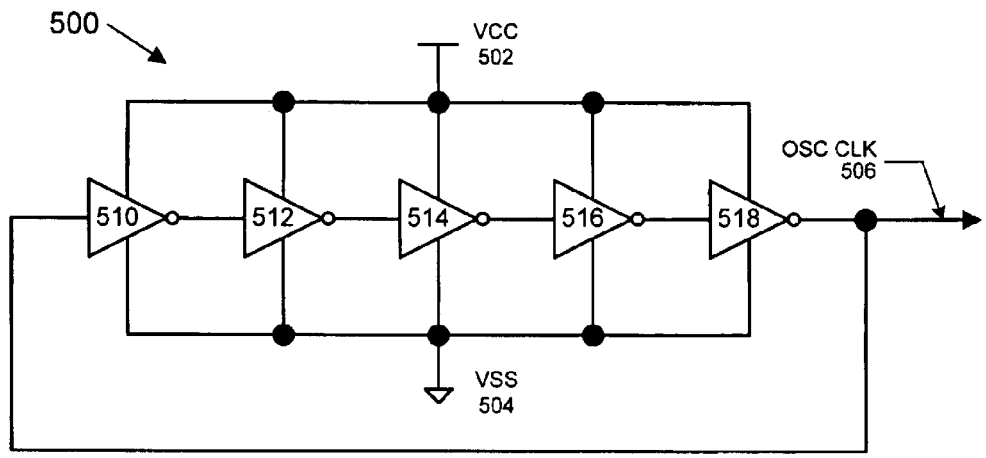
FIG. 5A is a one embodiment of a ring oscillator for a voltage sensor transducer.

FIG. 5A is a one embodiment of a ring oscillator 500 for a voltage sensor transducer. The ring oscillator 500 of this embodiment comprises of five inverters 510, 512, 514, 516, 518, connected together in series as a closed loop. These inverters 510, 512, 514, 516, 518, are coupled to a ground potential VSS 504 and a supply voltage VCC 502. The ring oscillator 500 provides an analog clock signal OSC CLK 506. The output frequency of a ring oscillator 500 is a monotonic function of the local power supply voltage, i.e. frequency∝VCC. The ring oscillator output 506 can be sent back to the clock generator where its oscillation frequency embodies the local VCC 502. The ring oscillator 500 can function as a voltage sensor by communicating OSC CLK 506 to the clock logic and clock generator, as OSC CLK 506 reflects the VCC supply voltage in and around the ring oscillator location. For sensors located far away from the clock generator, the sensor output signal may have to travel a long distance. In one embodiment, one or more buffers can be used to help maintain the strength of the signal without negatively impacting the encoded frequency.

Other types of voltage sensors are available and can be implemented in accordance with the present invention depending on particular needs and design features. For instance, a voltage sensor can comprise of an analog to digital converter that takes the local voltage as one input and a band-gap voltage reference as a reference value. The A/D converter can communicate the encoded numerical value of the local voltage over a digital bus as a binary set of bits of 8 or 16 bits back to the clock generator block. This digital embodiment in essence relocates the counter functionality from within the adjustment circuit block out to each local voltage sensor. However, this particular embodiment can be more expensive in die space due to the additional signal lines and A/D converters.

In an alternative embodiment of a voltage sensor, "known" timing critical circuit elements are incorporated within the ring oscillator structure 500 described above. For example, an adder bit-slice from a floating point unit can be embedded within the ring oscillator structure. As a result, the sensor can provide a more accurate reflection of the circuit delay behavior of the respective circuit blocks. For another embodiment, interconnect elements are also incorporated into the oscillator structure. Because certain microprocessor critical paths are interconnect dominated, the incorporation of an appropriate amount of interconnects can enable a better prediction.

Figure 5B:
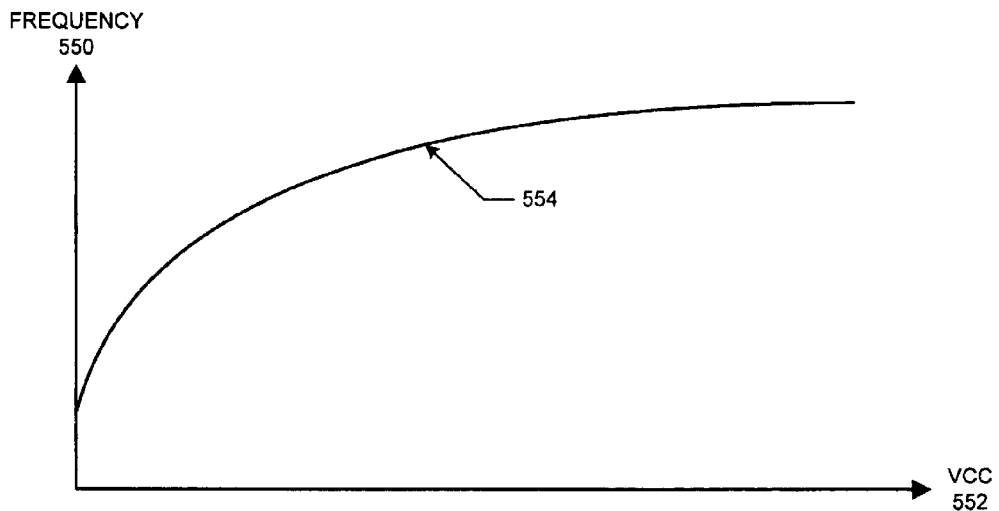
FIG. 5B is a graph of the frequency of a voltage sensor output versus VCC.

FIG. 5B is a graph of the frequency 550 of a voltage sensor output 554 versus VCC 552 for one embodiment of a voltage sensor such as the ring oscillator 500 of FIG. 5A. The frequency of OSC CLK 506 is directly dependent on the value of the VCC supply voltage. As the VCC voltage sampled fluctuates, the oscillator behavior changes as reflected in the oscillator output signal 506. Thus if VCC 502 is low, OSC CLK 506 oscillates slower and the frequency is lower. Similarly, if VCC 502 is high, OSC CLK 506 is faster and the frequency is higher. An evaluation of the frequencies of various ring oscillators at the clock logic can yield information about voltage values at different locations on the die.

Figure 6A:
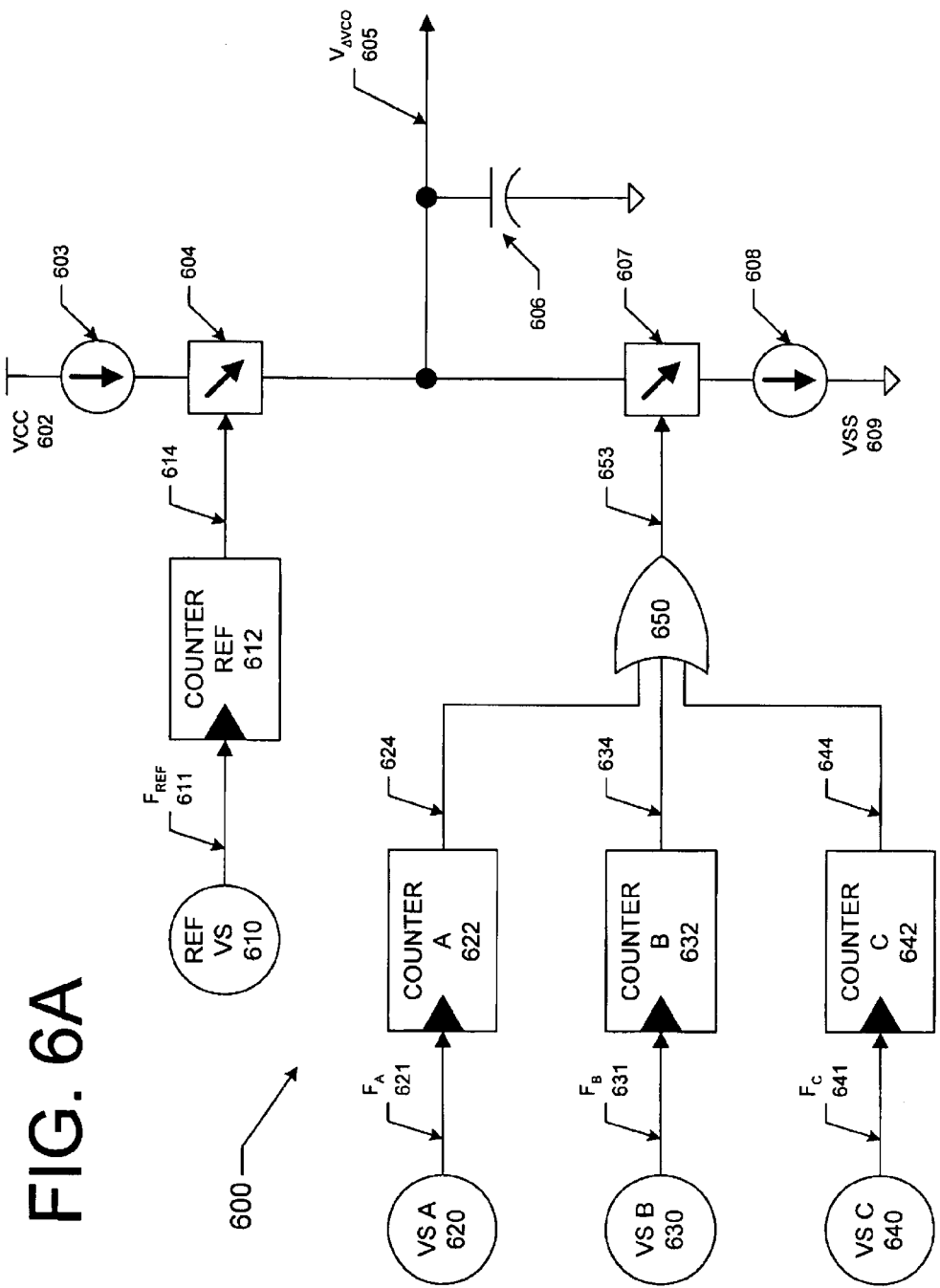
FIG. 6A is a dynamically frequency adjustment circuit of one embodiment.

FIG. 6A is a dynamic frequency adjustment circuit 600 of one embodiment. The frequency adjustment circuit 600 provides an ability to tune the core clock frequency in accordance to outputs from voltage sensors 610, 620, 630, 640. For this embodiment, ring oscillator type of voltage sensors are deployed on the die. The clock generator can receive streamed inputs of digital signals that are frequency encoded with respective local VCC levels. Located adjacent to the clock generator is a reference voltage sensor 610 to sense the VCC supply value at the clock generator itself. This output 605 of this circuit 600 is a corrective voltage, $V_{\Delta VCO}$, that can be used to adjust the core clock from the clock generator.

For this embodiment, the frequency adjustment circuit 600 comprises of a first current based charge pump 603 powered by VCC 602 and a second charge pump 608 to sink charge to VSS 609. The charge pump is to provide charge to a storage capacitor 606 coupled to the circuit output signal $V_{\Delta VCO}$ 605. Also coupled in series between the two charge pumps 603, 608, are voltage controlled mechanisms $I_{up}$ 604, $I_{DOWN}$ 607, to limit the passage of current from the first charge pump 603 to the second charge pump 607. The structure between VCC 602 and VSS 609 comprising the current sources 603, 608, and control mechanisms 604, 607, can also be referred to as a comparator circuit. Depending on whether the value of $V_{\Delta VCO}$ 605 and the charge stored on capacitor 606 needed to be increased or decreased, either one or both of the charge up control mechanism 604 or the discharge control mechanism 607 are appropriately enabled. For this embodiment, the charge up and discharge mechanisms 604, 607, are switches.

The adjustment circuit 600 of this embodiment also includes a reference voltage sensor REF VS 610 and voltage sensors VS A 620, VS B 630, VS C 640, which are located at different locations on the die. Each of the sensors 610, 620, 630, 640, are coupled to its own counter 612, 622, 632, 642, respectively. For this embodiment, the counters 612, 622, 632, 642, are down counters initialized with some predetermined counts. The counters 612, 622, 632, 642, receive frequency encoded signals 611, 621, 631, 641, from the sensors 610, 622, 630, 640, that indicate the condition of the VCC supply voltage at various places. The higher the VCC voltage that is sensed, the higher the frequency of the signal sent from a sensor. Conversely, the lower the sensed VCC voltage, the lower the oscillation frequency of the sensor signal. Each counter 612, 622, 632, 642, is to count the number of oscillations or transitions that are communicated from its respective sensor 610, 620, 630, 640. The counters 612, 622, 632, 642, in turn is to each output a pulse having a pulse width dependent on the frequency of the sensor signals 611, 621, 631, 641.

The voltage information of reference sensor 610 is treated as the base standard or reference level for the expected VCC voltage. For this embodiment, the VCC supply available near the clock generator is a stable value. The output voltage 614 of the reference counter 612 is to drive the charge up mechanism 604 and thus control the current flow from the first charge pump 603 to $V_{AVCO}$ 605. The outputs 622, 632, 642, of the other sensors 620, 630, 640, are or-ed together at the logic or gate 650, the result 653 to drive the discharge mechanism 607. Thus the distributed sensors 620, 630, 640, collectively control the current flow from $V_{AVCO}$ 605 to the second charge pump 608. Depending on a range of issues including power transients, voltage droops, signal routing, process variations, heat dissipation, etc., the VCC supply level can vary widely across a single die.

Because the counter results 622, 632, 642, are or-ed together, the lowest sensed VCC supply voltage should control the discharge mechanism 607 in this embodiment. This situation exists in this embodiment because the frequency of the sensor output is directly proportional to the sensed voltage, whereas the counter output pulse width is inversely proportional to the frequency. Thus for a higher sensed voltage, the resultant counter pulse is shorter, whereas the resultant counter pulse is longer for a lower sensed voltage. The output 653 of the or gate 650 is dependent on the longest width pulse, essential the lowest frequency or lowest sensor reading. For one embodiment, the sensor outputs are sampled every 50 or 100 clock pulses. In another embodiment, the output can be sampled continuously or less often depending on the particular implementation and the desired response speed.

For example, if the incoming sensor data collectively indicate that the VCC supply voltage is higher than at the clock generator or reference sensor 610, the turn-on time for the discharge control mechanism 607 will be less than the turn-on time for the charge up control mechanism 604. The result is a increase $V_{AVCO}$ voltage on the storage capacitor 606. The addition of $V_{AVCO}$ 605 to the VCO control voltage $V_{CONTROL1}$ 455 coupled clock generator of FIG. 4 is to adjust the frequency of the core clock $CLOCK_2$ 414. A similar procedure can be used if voltage sensors indicate that the VCC supply is low elsewhere and the core clock frequency should be lowered. In this case, the discharge mechanism 607 is turned on more often so the discharging current source 608 reduces the $V_{AVCO}$ voltage at the storage capacitor 606. If the core clock frequency is lowered because of a low power condition, another adjustment can be made when the VCC voltage has risen sufficiently such that the frequency is increased. Because this embodiment tracks the frequency with the voltage in a tight manner, a large guard band is not necessary to ensure proper operation. Furthermore, the frequency can gradually follow the voltage changes instead of making large adjustments to catch up with big voltage steps.

Figure 6B:
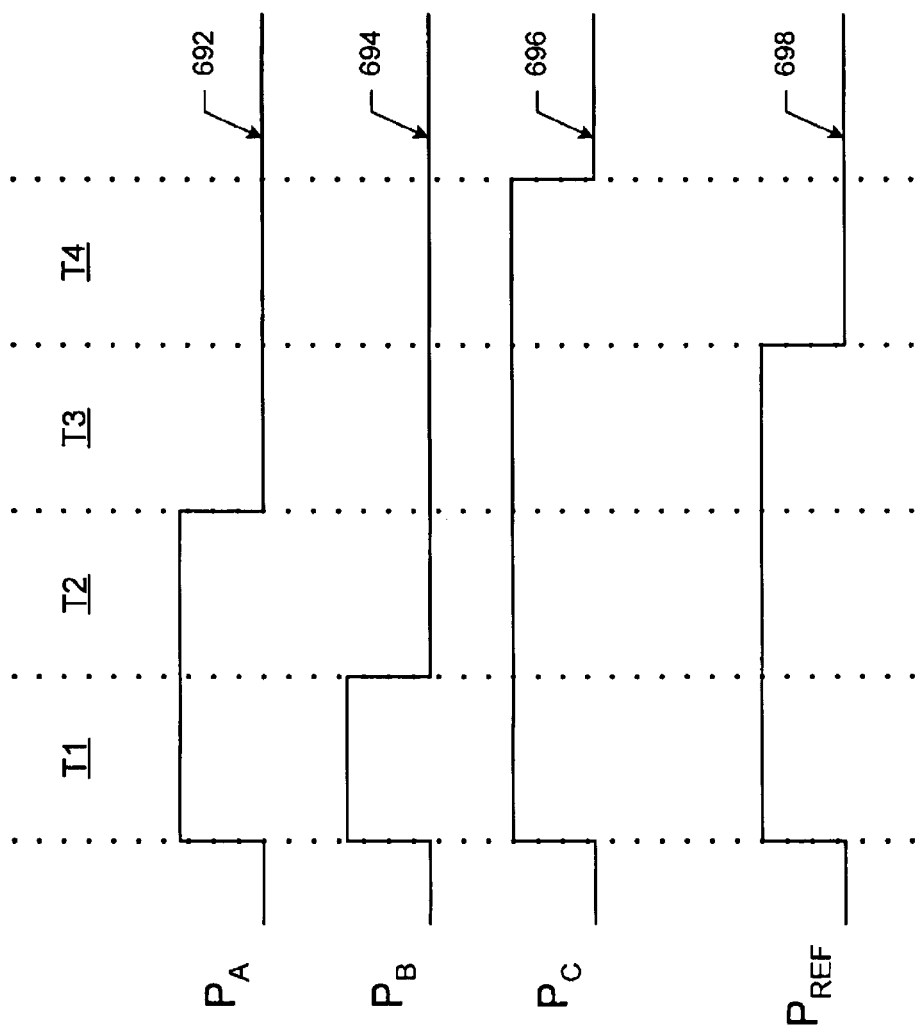
FIG. 6B is a graph of outputs from counters in response to voltage sensors.

FIG. 6B is a graph of outputs from counters in response to voltage sensors. As streams of sensor readings 611, 621, 631, 641, are fed to the down counters 612, 622, 632, 642, corresponding output pulses 692, 694, 696, 698, are produced. In this example, signals $P_A$ 692, $P_B$ 694, $P_C$ 696, $P_{REF}$ 614, are outputted from counter A 622, counter B 632, counter C 642, counter REF 612, respectively, in response to data from sensors VS A 620, VS B 630, VS C 640, REF VS 610, respectively. In FIG. 6B, $P_2<P_1<P_{REF}<P_3$ because $F_3<F_{REF}<F_1<F_2$, as pulse width $\propto$ 1/frequency. For this example, the voltage sensed at VS B 630 is the highest and its output has the highest frequency, while the voltage sensed at VS C 640 is the lowest and its output has the lowest frequency. Thus the output $P_2$ 694 of counter B 632 will have a high time proportional to the number of counts. The counter outputs $P_A$ 692, $P_B$ 694, $P_C$ 696, $P_{REF}$ 698, are or-ed together to determine the highest frequency and thus lowest voltage possible to prevent circuit failure. This or-ed result is to control the discharge duration of the clock structure.

Figure 7A:
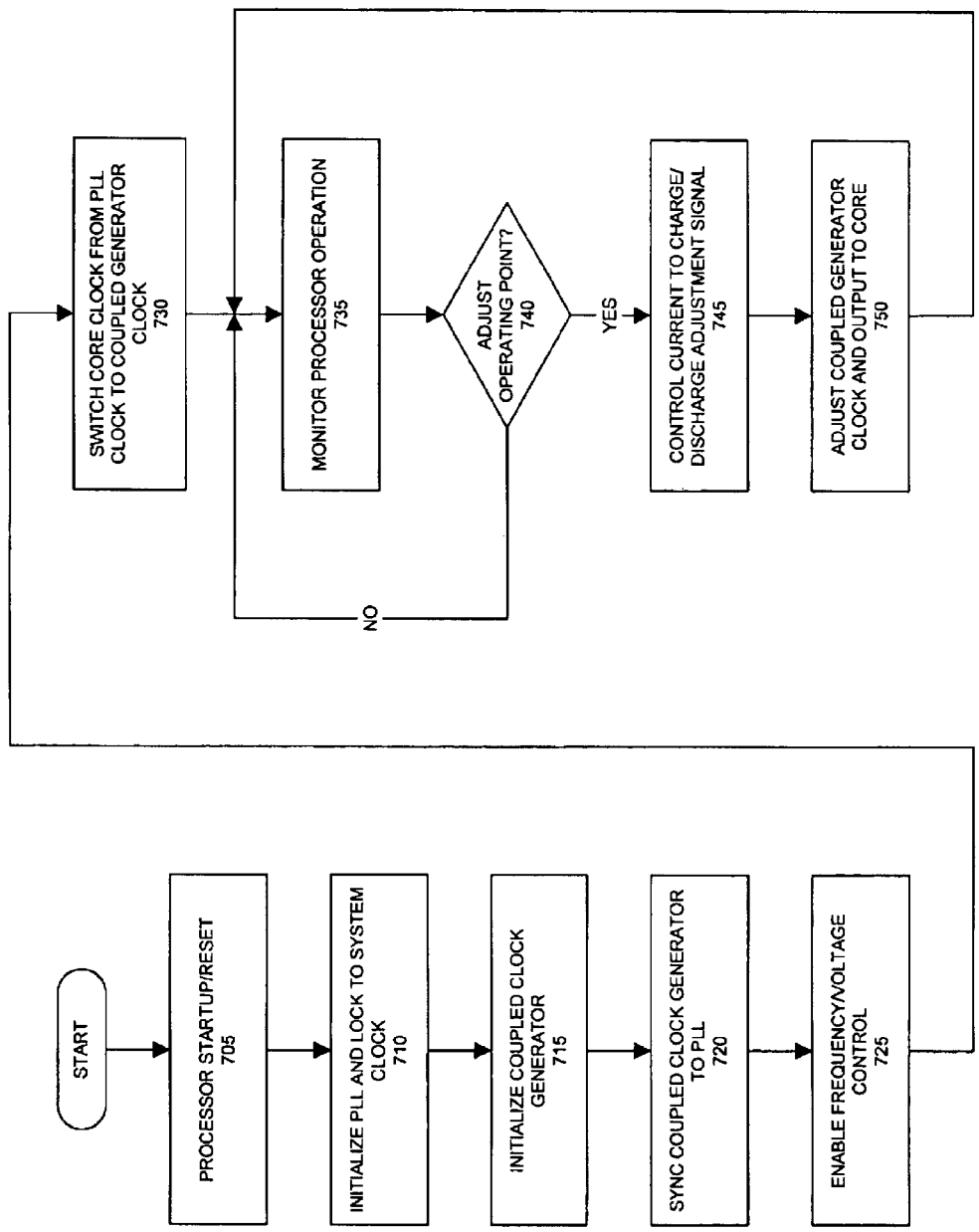
FIGS. 7A–B are flow charts showing one embodiment of a method in accordance with the present invention for dynamically adjusting clock frequencies in response to voltage variations.
Figure 7B:
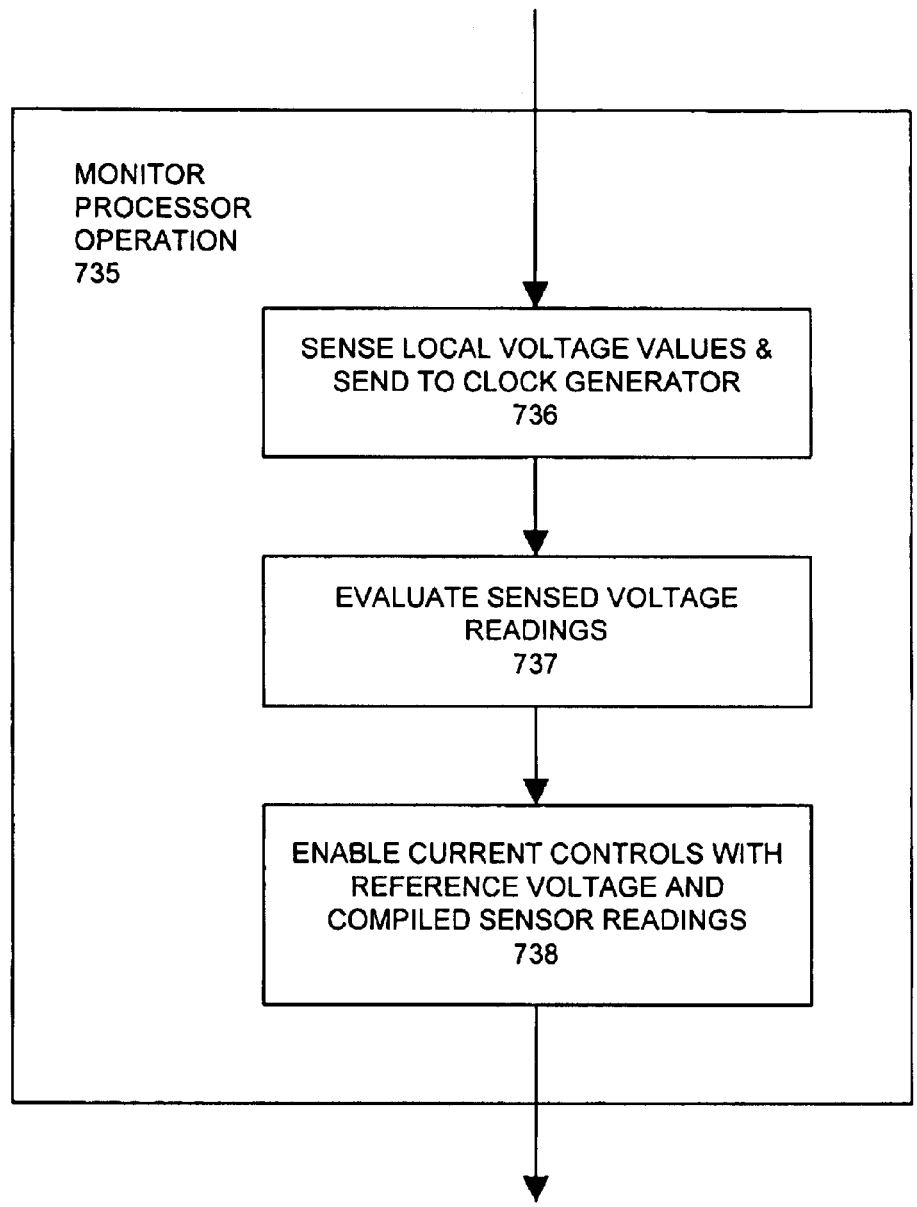

FIGS. 7A–B are flow charts showing one embodiment of a method in accordance with the present invention for dynamically varying clock frequencies in response to voltage variations. This example generally describes the operation of a dynamically variable frequency clock generator mechanism of one embodiment when adjusting the processor voltage and frequency to minimize the impact of voltage droops and transients on the VCC supply voltage.

At block 705, a processor is initialized upon startup or reset. The clock system is also started up. At block 710, the PLL clock generator is initialized and locked to the system clock. The processor core is supplied with the clock signal from the PLL. The coupled clock generator of this embodiment is initialized at block 715. However, the output signal of the coupled clock generator is not yet used. The initial frequency of the coupled clock generator will follow the frequency of the PLL. The PLL and coupled clock generator are synced together via control signals to their VCOs at block 720. Because of the clock signal synchronization, the coupled oscillator clock signal can be transparently substituted for the PLL clock signal. The frequency/voltage control logic is enabled at block 725. The frequency/voltage control can shift the processor operating point by adjusting the processor core frequency and the processor supply voltage.

As the frequency/voltage control logic takes control, the core clock is switched at block 730 from the PLL clock to being supplied with the coupled clock generator clock signal. At block 735, the processor operation is monitored. The frequency/voltage control logic and clock circuitry analyze inputs from sensors that track the local VCC supply voltages. For another embodiment, other sensors can also monitor current, power, temperature, and/or processing load. The sensor values are evaluated to determine how the supply voltage is distributed across the processor.

The monitoring activity of block 735 is described in greater detail at FIG. 7B. At block 736, sensors sense the local voltage values and send the data to the clock generator. The frequency adjustment mechanism in the clock generator evaluates the sensed voltage readings at block 737. The current control blocks that can shift the adjustment signal are enabled at block 738 with the reference voltage and a compilation of the sensor readings. For this embodiment, the compilation is created through the or-ing of all the sensor to arrive at the lowest voltage reading.

Based on what the sensors indicate, the controller can find an appropriate operating point for the processor. At block 740, the VCC adaptive dynamically variable frequency mechanism decides whether to adjust the operating point. The frequency adjustment mechanism of one embodiment compares the lowest VCC voltage value with a reference VCC value to determine at what the frequency should be set for the supply voltages. If the frequency and voltage values are the same or approximate to the present values or otherwise within acceptable limits, the core clock frequency and processor operating point are not adjusted. The frequency adjustment mechanism continues to monitor the processor at block 735 and queries the sensors. If the sensed VCC voltage values are different from the present reference voltage, the clock frequency is adjusted.

The frequency adjustment mechanism outputs the new frequency settings. At block 745, the charge/discharge currents to the adjustment signal are controlled and manipulated. If the sensed voltages are higher than the reference value, the value of the adjustment voltage is increased. These settings have been picked based on the lowest sensed VCC supply voltage value. For one embodiment, the settings are chosen to provide optimal processor efficiency while still preventing timing errors. At block 750, the new frequency setting takes effect at the coupled clock generator. The coupled clock generator clock signal is adjusted and is outputted to the processor core. The frequency adjustment mechanism continues to monitor the processor and evaluates the sensors for further changes.

The examples above have been described in the context of a single processor. In a multiprocessor system, the method can be performed concurrently in each processor. Each processor can contain an adaptive variable frequency clock system. For example, each processor can be adjusting its own frequency and voltage settings independent of the other processors in the system. However, the overall system software may have the capability to control all of the processor either through a hardware pin or software inputs.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. An apparatus comprising:
   a first voltage sensor to sense a first value of a supply voltage at a first location, said supply voltage to power circuitry local to said first voltage sensor, said first voltage sensor to provide a first output signal encoded with said first value;
   a second voltage sensor to sense a second value of said supply voltage at a second location, said supply voltage to power circuitry local to said second voltage sensor, said second voltage sensor to provide a second output signal encoded with said second value;
   a frequency adjustment circuit coupled to said first voltage sensor and to said second voltage sensor, said frequency adjustment circuit to evaluate said first output signal and said second output signal and to output a frequency adjustment signal based on a result of said evaluation, said result to indicate a lowest value for said supply voltage; and
   a clock generator coupled to said adjustment circuit, said clock generator to receive said frequency adjustment signal and to generate a variable frequency clock signal, said variable frequency clock signal to have a clock frequency sufficiently low to avoid timing errors at said lowest value for said supply voltage.

2. The apparatus of claim 1 wherein said second voltage sensor is a reference voltage sensor located proximate to said clock generator, said reference voltage sensor to detect a value of said supply voltage coupled to said clock generator.

3. The apparatus of claim 2 wherein said first value of said supply voltage is encoded as a first frequency of said first output signal and said second value of said supply voltage is encoded as a second frequency of said second output signal.

4. The apparatus of claim 3 wherein said frequency adjustment circuit further comprises:
   a first counter to receive said first output signal, said first counter to decode said first output signal and to provide a first pulse, said first pulse to have a first pulse width corresponding to said first value of said supply voltage;
   a second counter to receive said second output signal, said second counter to decode said second output signal and to provide a second pulse, said second pulse to have a second pulse width corresponding to said second value of said supply voltage; and
   a comparator circuit coupled to said first counter and to said second counter, said comparator circuit to output said frequency adjustment signal based on said first pulse width and said second pulse width, wherein said first pulse is to control a discharge rate to said frequency adjustment signal and said second pulse is to control a charge up rate to said frequency adjustment signal.

5. The apparatus of claim 4 wherein said first pulse width is wider than said second pulse width when said first value of said supply voltage is less than said second value of said supply voltage, and said first pulse width is narrower than said second pulse width when said first value of said supply voltage is greater than said second voltage value of said supply voltage.

6. The apparatus of claim 5 further comprising a third voltage sensor to sense a third value of said supply voltage at a third location, said supply voltage to power circuitry local to said third voltage sensor, said third sensor to provide a third output signal encoded with said third value.

7. The apparatus of claim 6 wherein said frequency adjustment circuit further comprises:
   a third counter to receive said third output signal, said third counter to decode said third output signal and to provide a third pulse, said third pulse to have a third pulse width corresponding to said third value of said supply voltage; and
   a logic OR gate coupled to said first counter and to said third counter; said OR gate to OR together said first pulse and sand third pulse to produce a collective pulse, said collective pulse coupled to said comparator circuit to control said discharge rate to said frequency adjustment signal.

8. A method comprising:
   sampling a supply voltage at a plurality of locations;
   communicating values of said supply voltage to a clock generator; and
   adjusting a clock frequency of a clock signal generated from said clock generator in response to an evaluation of said sampled values of said supply voltage.

9. The method of claim 8 wherein said sampling further comprises sensing said supply voltage with an oscillator type sensor at each of said plurality of locations, said sensor to provide an output signal encoded with a value of said supply voltage as a frequency of said output signal.

10. The method of claim 9 wherein said communicating further comprises generating from each of said plurality of locations said frequency encoded output signal.

11. The method of claim 10 further comprising buffering said frequency encoded output signals to maintain signal strength without altering frequency of said frequency encoded output signals.

12. The method of claim 11 further comprising processing each of said frequency encoded output signals, wherein said processing comprises decoding each frequency encoded output signal into a pulse with a pulse width representative of said local value of said supply voltage.

13. The method of claim 12 further comprising evaluating pulses decoded from said frequency encoded output signals to determine a lowest supply voltage value, said evaluating comprising OR-ing together said pulses to find a longest length pulse, as a wider pulse width indicates a lower supply voltage value.

14. The method of claim 13 further comprising generating a frequency adjustment signal based on lowest supply voltage value to adjust said clock frequency of said clock signal.

15. The method of claim 14 wherein said clock signal is to tuned to achieve an operating point matching said lowest supply voltage value.

16. The method of claim 15 wherein said adjusting said clock frequency is made dynamically without halting or pausing said clock signal.

17. A processor comprising:
a processor core;
a first voltage sensor to sense a first value of a supply voltage at a first logic block in said processor core, said supply voltage to power circuitry local to said first voltage sensor, said first voltage sensor to provide a first output signal encoded with said first value;
a reference voltage sensor to sense a second value of said supply voltage at a reference location, said supply voltage to power circuitry local to said reference voltage sensor, said reference voltage sensor to provide a second output signal encoded with said second value;
a clock generator coupled to said processor core, said clock generator to receive said first output signal and said second output signal, said clock generator to generate a variable frequency clock signal to said processor core based on said it value of said supply voltage and said second value of said supply voltage.

18. The processor of claim 17 wherein said clock generator further comprises a frequency adjustment circuit coupled to said first voltage sensor and to said reference voltage sensor, said frequency adjustment circuit to evaluate said first output signal and said second output signal and to output a frequency adjustment signal based on a result of scud evaluation, said result to indicate a lowest value for said supply voltage.

19. The processor of claim 18 wherein said frequency adjustment circuit further comprises:
a first counter to receive said first output signal, said first counter to decode said first output signal and to provide a first pulse said first pulse to have a first pulse width corresponding to said first value of said supply voltage;
a second counter to receive said second output signal said second counter to decode said second output signal and to provide a second pulse, said second pulse to have a second pulse width corresponding to said second value of said supply voltage; and
a comparator circuit coupled to said first counter and to said second counter, said comparator circuit to output said frequency adjustment signal based on said first pulse width and said second pulse width, wherein said first pulse is to control a discharge rate to said frequency adjustment signal and said second pulse is to control a charge up rate to said frequency adjustment signal.

20. The processor of claim 19 wherein said first value of said supply voltage is encoded as a first frequency of said first output signal and said second value of said supply voltage is encoded as a second frequency of said second output signal.

21. The processor of claim 20 wherein said first pulse width is wider than said second pulse width when said first value of said supply voltage is less than said second value of said supply voltage, and said first pulse width is lower than said second pulse width when said first value of said supply voltage is greater than said second voltage value of said supply voltage.

22. The processor of claim 21 wherein said clock generator further comprises a voltage controlled oscillator (VCO) to generate said variable frequency clock signal, said frequency adjustment signal coupled to said VCO to dynamically adjust a clock frequency of said variable frequency clock signal in order to adapt said clock frequency to a lowest value of said supply voltage.

23. The processor of claim 22 further comprising:
a third voltage sensor to sense a third value of said supply voltage at a third location, said supply voltage to power circuitry local to said third voltage sensor, said third voltage sensor to provide a third output signal encoded with said third value; and
said frequency adjustment circuit further comprising:
a third counter to receive said third output signal, said third counter to decode said third output signal and to provide a third pulse, said third pulse to have a third pulse width according to said third value of said supply voltage; and
a logic OR gate coupled to said first counter and to said third counter, said logic OR gate to OR together said first pulse and said third pulse to produce a collective pulse, said collective pulse coupled to said comparator circuit to control said discharge rate to said frequency adjustment signal.

24. A system comprising:
a memory coupled to a bus;
a processor coupled to said bus said processor comprising:
a processor core; and
a clock system comprising:
a first voltage sensor to sense a first value of a supply voltage at a first location, said supply voltage to power circuitry local to said first voltage sensor, said first voltage sensor to provide a first output signal encoded with said first value;
a second voltage sensor to sense a second value of said supply voltage at a second location, said supply voltage to power circuitry local to said second voltage sensor, said second voltage senor to provide a second output signal encoded with said second value;
a frequency adjustment circuit coupled to said first sensor and to said second sensor, said frequency adjustment circuit to evaluate said first output signal and said second output signal and to output a frequency adjustment signal based on a result of said evaluation, said result to indicate a lowest value for said supply voltage; and
a clock generator coupled to said frequency adjustment circuit, said clock generator to receive said frequency adjustment signal and to generate a variable frequency clock signal to said processor core, said variable frequency clock signal to have a clock frequency sufficiently low to avoid timing errors in said processor core at said lowest value for said supply voltage.

25. The system of claim 24 wherein said second voltage sensor is a reference voltage sensor located proximate to said clock generator, said reference voltage sensor to detect a value of said supply voltage coupled to said clock generator.

26. The system of claim 25 wherein said first value of said supply voltage is encoded as a first frequency of said first output signal and said second value of said supply voltage is encoded as a second frequency of said second output signal.

27. The system of claim 26 wherein said frequency adjustment circuit further comprises:

a first counter to receive said first output signal, said first counter to decode said first output signal and to provide a first pulse, said first pulse to have a first pulse width corresponding to said first value of said supply voltage;

a second counter to receive said second output dial said second counter to decode said second output signal and to provide a second pulse, said second pulse to have a second pulse width corresponding to said second value of said supply voltage; and a comparator circuit coupled to said first counter and to said second counter, said comparator circuit to output said frequency adjustment signal based on said first pulse width and said second pulse width, wherein said first pulse is to control a discharge rate to said frequency adjustment signal and said second pulse is to control a charge up rate to said frequency adjustment signal.

28. The system of claim 27 wherein said first pulse width is wider than said second pulse width when said first value of said supply voltage is less than said second value of said supply voltage, and said first pulse width is narrower than said second pulse width when said first value of said supply voltage is greater than said second voltage value of said supply voltage.

29. An apparatus comprising:

a first voltage sensor to sense a first value of a supply voltage at a first location on a die;

a first analog-to-digital (A/D) converter coupled to receive a first voltage reading from said first voltage sensor, said fist A/D converter to convert said first voltage reading from an analog value to an coded numerical value;

a frequency adjustment circuit coupled to said first voltage sensor, said frequency adjustment circuit to evaluate said encoded numerical value in relation with a reference and to output a frequency adjustment signal based on a result of said evaluation, said result to indicate a lowest value for said supply voltage;

a clock generator coupled to said frequency adjustment circuit, said clock generator to receive said frequency adjustment signal and to generate a variable frequency clock signal, said variable frequency clock signal to have a clock frequency sufficiently low to avoid timing errors at said lowest value for said supply voltage; and a second voltage sensor located proximate to said clock generator, said second voltage sensor to sense a reference value of said supply voltage.

30. The apparatus of claim 29 further comprising a second A/D converter coupled to receive a second voltage reading from said second voltage sensor, said second A/D converter to convert said second voltage reading from an analog reference value to an encoded numerical reference value, and said encoded numerical reference value to be provided to said frequency adjustment circuit as said reference.

* * * * *

UNITED STATES PATENT AND TRADEMARK OFFICE
CERTIFICATE OF CORRECTION

PATENT NO. : 6,762,629 B2
DATED : July 13, 2004
INVENTOR(S) : Tam et al.

It is certified that error appears in the above-identified patent and that said Letters Patent is hereby corrected as shown below:

Column 3,
Line 15, delete ";" and insert -- . --.

Column 5,
Lines 26 and 27, delete "110" and insert -- I/O --.

Column 9,
Line 8, delete "PLI" and insert -- PLL --.

Column 14,
Line 37, delete "sand" and insert -- said --.
Line 52, before "value", insert -- local --.

Column 15,
Line 30, delete "it" and insert -- first --.
Line 38, delete "scud" and insert -- said --.
Line 44, after the first occurrence of "first pulse", insert -- , --.
Line 46, after "second output signal", insert -- , --.

Column 16,
Line 21, delete "according" and insert -- corresponding --.
Line 43, delete "senor" and insert -- sensor --.

UNITED STATES PATENT AND TRADEMARK OFFICE
CERTIFICATE OF CORRECTION

PATENT NO. : 6,762,629 B2
DATED : July 13, 2004
INVENTOR(S) : Tam et al.

It is certified that error appears in the above-identified patent and that said Letters Patent is hereby corrected as shown below:

Column 17,
Line 9, delete "dial" and insert -- signal, --.

Column 18,
Line 3, delete "fist" and insert -- first --.
Line 4, delete "coded" and insert -- encoded --.

Signed and Sealed this

Seventh Day of February, 2006

JON W. DUDAS
*Director of the United States Patent and Trademark Office*